(12) United States Patent
Riley

(10) Patent No.: US 6,404,291 B1
(45) Date of Patent: Jun. 11, 2002

(54) LINEAR LOW NOISE PHASE LOOP FREQUENCY SYNTHESIZER USING CONTROLLED DIVIDER PULSE WIDTHS

(75) Inventor: Thomas A. D. Riley, Osgoode (CA)

(73) Assignee: Philsar Semiconductor Inc., Nepean (CA)

(*) Notice: Subject to any disclaimer, the term of this patent is extended or adjusted under 35 U.S.C. 154(b) by 0 days.

(21) Appl. No.: 09/753,626

(22) Filed: Jan. 4, 2001

(30) Foreign Application Priority Data

Jan. 6, 2000 (CA) .............................................. 2295435

(51) Int. Cl.[7] .......................... H03L 7/087; H03L 7/10; H03L 7/18; H03D 13/00; H03B 19/00
(52) U.S. Cl. .......................... 331/11; 331/1 A; 331/14; 331/16; 331/17; 331/25; 327/12; 327/43; 327/117; 327/159
(58) Field of Search .............................. 331/1 A, 10, 11, 331/14, 16, 17, 18, 25; 327/3, 5, 7–12, 40–43, 117, 118, 156–159; 360/51; 375/376; 455/260

(56) References Cited

U.S. PATENT DOCUMENTS

| | | | |
|---|---|---|---|
| 4,267,514 A | 5/1981 | Kimsey | |
| 4,884,035 A | 11/1989 | Cok et al. | |
| 5,027,373 A | 6/1991 | Cok | |
| 5,142,246 A | * 8/1992 | Petersson | ..................... 331/11 |
| 5,699,387 A | 12/1997 | Seto et al. | |
| 5,977,801 A | 11/1999 | Boerstler | |
| 6,094,078 A | 7/2000 | Suzuki | |

FOREIGN PATENT DOCUMENTS

| | | |
|---|---|---|
| EP | 0 547 773 A1 | 6/1993 |
| WO | WO 00/25427 | 5/2000 |

OTHER PUBLICATIONS

Patent Abstracts of Japan, vol. 1999, No. 10, Aug. 31, 1999 & JP 11 127076 A (Matsushita Electric Ind. Co Ltd) May 11, 1999.

* cited by examiner

Primary Examiner—David Mis
(74) Attorney, Agent, or Firm—Harold C. Baker; Robert A. Wilkes; Robert G. Hendry

(57) ABSTRACT

A method and an apparatus relating to a PLL circuit for frequency synthesizer applications. By using a composite PFD large and small phase variations between a reference signal and the divider output are compensated for. The composite phase frequency detector (PFD) has both a digital phase frequency detector (digital PFD) and an analog phase detector (analog PD) with the digital PFD compensating for large phase differences and the analog PD compensating for smaller phase differences. The PLL automatically chooses between these two components in the composite PFD by controlling the pulse width of the divider output. This is accomplished by synchronizing the dead zone of the digital PFD with the active pulse width of the divider output and by similarly synchronizing the phase detector window of the analog PD to be within both the dead zone of the digital PFD and the active pulse width of the divider output. Thus, during the active pulse of the divider output, the analog PD is operative while during the inactive pulse the digital PFD is operative. By essentially having only one PD active at any time, problems with analog/digital mixed circuits are avoided.

26 Claims, 7 Drawing Sheets

LINEAR LOW NOISE PHASE LOOP FREQUENCY SYNTHESIZER USING CONTROLLED DIVIDER PULSE WIDTHS

FIELD OF THE INVENTION

The present invention relates to frequency synthesizers and, more specifically to phase locked loop (PLL) frequency synthesizers which are suitable for wireless communications.

BACKGROUND OF THE INVENTION

PLL frequency synthesizers are well known in the art and are extensively used in wireless applications. Essentially, a PLL is a circuit that uses feedback to maintain an output signal in a specific phase relationship with a stable reference signal. Normally, a PLL circuit contains a minimum of 4 components:

a) a phase detector which produces output voltage proportional to the phase difference between two input signals, normally the reference signal and a frequency divider output;

b) a voltage controlled oscillator (VCO) that produces an AC output signal whose frequency is proportional to the input control voltage, normally received from the loop filter;

c) a divider that produces a signal whose frequency is a division of the input signal frequency, normally the output of the VCO; and d) a loop filter that controls the PLL dynamics.

It should be noted that the phase detector output is fed into the loop filter for filtering before being transmitted to the VCO. The VCO output is ideally the desired output from the PLL. For frequency synthesizer applications, the VCO produces a signal with a desired frequency. This desired frequency is generally much higher than the frequency of the stable reference signal and is ideally a multiple of that reference signal. By dividing the frequency of the output of the VCO and comparing the phase of that divided signal with the phase of the reference signal, any differences in phase, and therefore in frequency, can be compensated for by the phase detector and the VCO.

It is well known that PLL circuits for frequency synthesizer applications need to be low noise and must have low sensitivity to power supply variations. A frequency synthesizer having a PLL circuit with these characteristics would produce an output which is low in both spurious tones and noise.

Current PLL designs for frequency synthesizers which produce frequencies near or above the GHz range often require the output of the VCO to be synchronized to the PLL reference signal with a repeatability error of less than 1 picosecond ($10^{-12}$ sec). This repeatability can be impaired in the PLL or in any of its components by interference, commonly referred to as cross-talk, from either nearby circuits or from the components which actually make up the PLL. The amount of cross talk that occurs in the PLL depends on the sensitivity to power supply variations and other sources of coupling from one PLL component to another. This problem can be more severe in a highly integrated application specific integrated circuit (ASIC) or when the frequency planing of these interfering signals cannot be well controlled. Failure to meet these repeatability requirements can result in spurious output tones at the synthesizer output. Such an occurrence can possibly prevent qualification of the radio to public standards.

Given the above, cross talk is not the only source of spurious tones. Different combinations of phase detectors and dividers also produce different levels of spurious output tones at multiples of the PLL reference frequency. One method of avoiding this pitfall is the use of filters. However, such filters can be expensive. To avoid expensive filtering components, it is desirable to reduce the amplitude of these tones.

One approach to solve the problem is to use edge triggered phase detectors. This avoids the problem of obtaining a 50% duty cycle, but it also consumes more power and introduces more sensitivity to power supply variations as compared to a single gate phase detector such as an exclusive OR.

Another area of concern for PLL circuits is its power consumption. To be suitable for wireless applications, such as in battery powered cellular phones, the PLL circuit would have to consume little power. This would extend the battery life of the wireless equipment.

A further problem with current PLL circuits is encountered when analog and digital circuits are used together. In mixed analog and digital integrated circuits, it is common practice to have sensitive analog operations occur at different times from digital operations. However, different phase detectors have different phase offsets at which they lock. This phase offset can reduce the amount of "quiet time" available for sensitive analog operations, such as sampling in switched capacitor filters. As an example, a phase offset of 90 degrees reduces the amount of quiet time by 50%

On the other hand, a phase offset of exactly zero can also cause problems. With a phase offset of zero, the divider and the source of the reference signal can experience cross-talk or dead zone problems.

By way of explanation, it should be noted that the dead zone refers to the attribute of a phase frequency detector (PFD) to produce an output which does not steer the output over a range of phase difference between the divider output and the reference signal. It should also be noted that other phase detectors (PD) typically do not operate linearly over a range of all possible phase errors. The region of operation where the phase detection is linear is often called the phase detection window of the phase detector.

Returning to the question of phase offsets, one possible solution to the problem of phase offsets is to use XOR phase detectors. These produce a two state output with substantial spurs (tones or frequency components) at twice the reference frequency. These spurs can be removed with substantial filtering but, as noted above, at a cost of increased component count and complexity.

Another suggested solution to the above problems deal with the divider. It has been suggested that a synchronous counter can be used to perform frequency division. However, this approach has typically been rejected for applications requiring low power.

Another approach has been to use a prescaler stage and a synchronous counter stage. Dividers made up of several divider stages are more vulnerable to power supply and bias line interference. Generally, divider stages that consume less power are also more vulnerable to interference. This has been addressed in the past by resynchronizing the divider output. However, such a measure is undesirable from a power consumption point of view because the resynchronizing circuitry can consume considerable power without adding any functionality to the divider chip.

Dividers, on their own, also pose problems. Dividers employing a single synchronous divider can sometimes produce a very narrow output pulse. This narrow pulse width contains high frequency spectral content which can interfere with sensitive analog circuits on or near the same chip.

The problem has traditionally been solved by either avoiding the use of fractional-N synthesizers or by providing shielding means to isolate sources of interference from sensitive circuits. Avoiding fractional-N synthesizers avoids the need for sensitive analog components on or near the synthesizer chip. Without these sensitive components, the potential sources of interference are avoided.

From the above, it is clear that a need exists for a PLL circuit for frequency synthesizer applications that avoid the problems disclosed.

SUMMARY OF THE INVENTION

The present invention is a method and an apparatus relating to a PLL circuit for frequency synthesizer applications. By using a composite PFD large and small phase variations between a reference signal and the divider output are compensated for. The composite phase frequency detector (PFD) has both a digital phase frequency detector (digital PFD) and an analog phase detector (analog PD) with the digital PFD compensating for large phase differences and the analog PD compensating for smaller phase differences. The PLL automatically chooses between these two components in the composite PFD by controlling the pulse width of the divider output. This is accomplished by synchronizing the dead zone of the digital PFD with the active pulse width of the divider output and by similarly synchronizing the phase detector window of the analog PD to be within both the dead zone of the digital PFD and the active pulse width of the divider output. Thus, during the active pulse of the divider output, the analog PD is operative while during the inactive pulse the digital PFD is operative. By essentially having only one PD active at any time, problems with analog/digital mixed circuits are avoided.

In one embodiment, the invention provides a phase locked loop (PLL) frequency synthesizer comprising, a composite phase frequency detection (CPFD) having a CPFD output; a loop filter having a voltage output; a voltage controlled oscillator (VCO) having a frequency output; and a divider having a divider output, the divider output having an active pulse with a first fixed width and an inactive pulse with a second width; wherein the CPFD is coupled to receive the divider output; the CPFD is coupled to receive a reference signal from a reference signal generator; the loop filter is coupled to receive the CPFD output; the VCO is coupled to receive the voltage output, said voltage output controllably affecting the frequency output; the divider is coupled to receive the frequency output; the loop filter generates the voltage output based on the CPFD output; the CFPD output indicates a phase difference between the divider output and the reference signal; and the frequency has a frequency that is a multiple of the frequency of the divider output.

In another embodiment, there is provided a composite phase frequency detector (PFD) for determining a phase difference between a reference signal and an input signal, the composite phase frequency detector comprising: a digital PFD having a dead zone, the said dead zone being a time range when the digital PFD has no output, an analog phase detector (PD) with a PD window, and a PD output, said PD window being a time range when the analog PD operates linearly; and a converter coupled to receive both the digital PFD output and the PD output; wherein an output of the converter is the CFPD output, the digital PFD is coupled to receive the reference signal and the input signal, the analog PD is coupled to receive the reference signal and the input signal; the digital PFD output indicates a presence and a magnitude of a phase difference between the reference signal and the input signal when the digital PFD is not in the dead zone, the analog PD output is proportional to the phase difference between the reference signal and the input signal when the analog PD is within the PD window, the dead zone is within the PD window and said digital PFD output being larger in magnitude than the analog PD output when the digital PFD is not in the dead zone.

In another embodiment, the invention provides an analog phase detector (PD) for detecting differences in phase between a reference signal and an input signal, the analog PD comprising, a NOT gate coupled to receive the reference signal and having an output, a first AND gate coupled to receive the output of the NOT gate and the input signal, said first AND gate having an output, a second AND gate coupled to receive the reference signal and the input signal, said second AND gate having an output and a subtractor circuit coupled to receive the output of the first AND gate and the output of the second AND gate, said subtractor circuit having an output which is the difference between the output of the first AND gate and the output of the second AND gate, wherein the output of the subtractor is the analog PD output.

In yet another embodiment, the invention provides a digital phase frequency detector (PFD) for detecting differences in phase and frequency between a reference signal and an input signal, the digital PFD comprising, a phase frequency detector coupled to receive the reference signal and the input signal, the PFD producing a pump up signal and a pump down signal, said pump up signal and pump down signal being produced depending on the presence and magnitude of a phase difference between the input signal and the reference signal, a PFD NOT gate coupled to receive the input signal, a first PFD AND gate coupled to receive an output of the PFD NOT gate and the pump up signal from the PFD, a second PFD AND gate coupled to receive the output of the PFD NOT gate and the pump down signal from the PFD and a combiner coupled to receive the output of the first PFD AND gate and the output of the second PFD AND gate, said combiner producing the digital PFD output based on the output of the first PFD AND gate and the output of the second PFD AND gate.

In yet another embodiment, the invention provides a frequency divider for dividing the frequency of an input signal, the divider having a divider output and comprising, a 2×1 multiplexer coupled to receive, a divide ratio signal; a pulse width signal; and the divider output, said multiplexer multiplexing between the divide ratio signal and the pulse width signal to produce a multiplexer output, said multiplexing being determined by the divider output; a synchronous counter coupled to receive the multiplexer output and the input signal, said counter being constructed and arranged to conduct a count down from a value determined by the multiplexer output with the input signal providing a clock signal, said counter producing a count pulse when the count down is terminated and a T flip-flop coupled to receive the count pulse from the synchronous counter and further coupled to receive the input signal as the clock signal, the T flip-flop having an output which is the divider output.

In another embodiment, the invention provides a method of compensating for and detecting phase differences between a reference signal and a subject signal with a controllable pulse width using: an analog phase detector having a phase detector window in which the analog phase detector is active during the phase detector window, the analog phase detector receiving the reference signal and the subject signal, a digital phase frequency detector having a dead zone in which the digital phase frequency detector is inactive during the dead zone, the digital phase frequency detector receiving the reference signal and the subject signal and a divider producing the subject signal with a controllable pulse width signal, the method comprising: controlling the controllable pulse width of the subject signal and synchronizing the phase detector window and the dead zone such that, the phase detector window and the dead zone are both within an active pulse of the subject signal.

In yet another embodiment, there is provided a method of compensating for and detecting phase signal differences between a reference signal and a subject signal with a pulse width, the method comprising activating a digital phase frequency detector to provide phase frequency detection between the reference signal and the subject signal during an inactive pulse of the. subject signal, activating an analog phase detector to provide phase detection between the reference signal and the subject signal during an active pulse of the subject signal.

BRIEF DESCRIPTION OF THE DRAWINGS

A better understanding of the invention may be obtained by reading the detailed description of the invention below, in conjunction with the following drawings, in which.

DESCRIPTION OF THE PREFERRED EMBODIMENT

Figure 1:
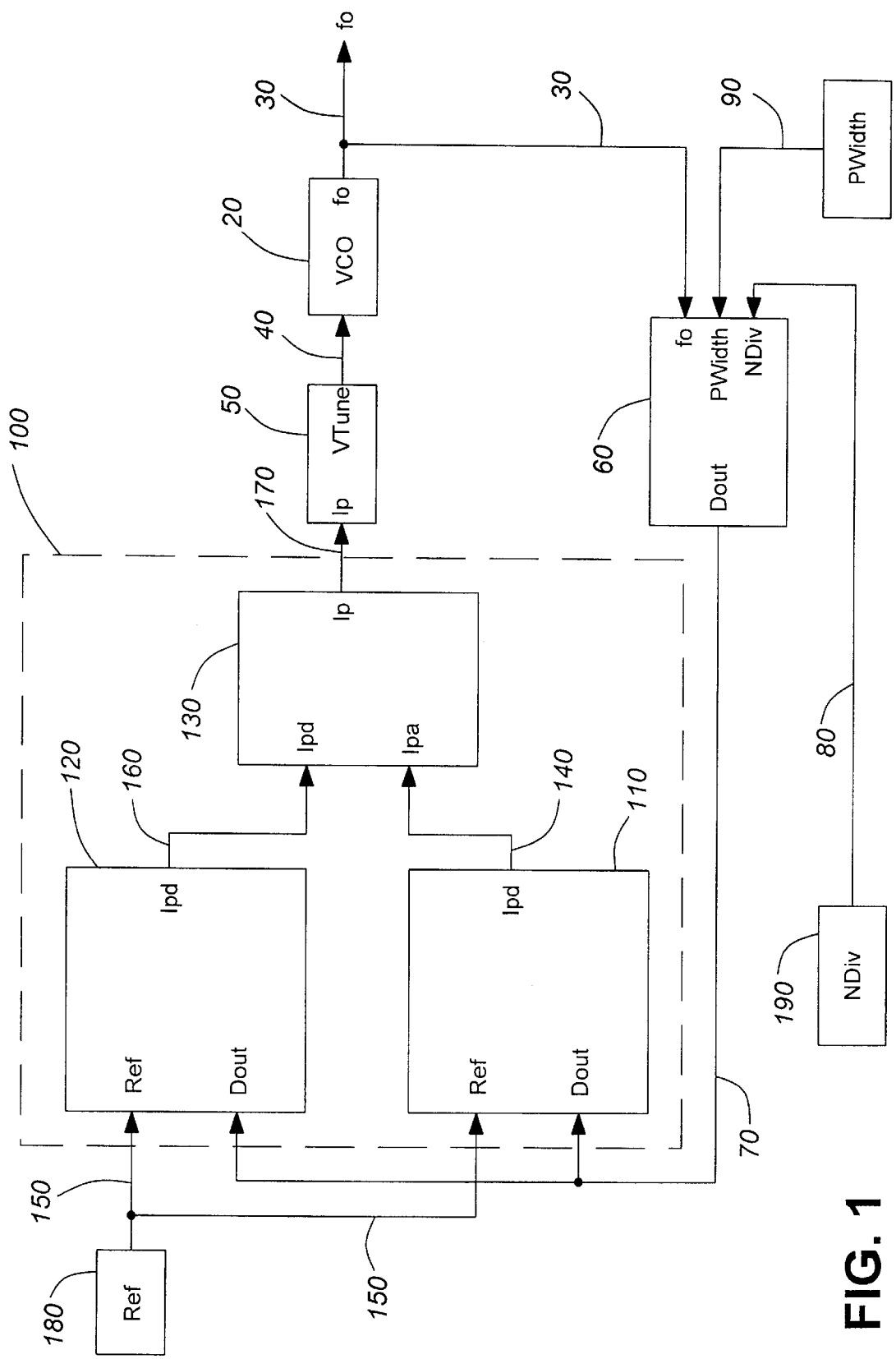
FIG. 1 is a schematic diagram of a PLL according to the invention.

Referring to FIG. 1, the components of the PLL circuit 10 are as follows:

Voltage Controlled Output (VCO) 20:

The VCO 20 provides a frequency output (fo) 30, the frequency of the output signal changes in response to a tuning signal (VTune) 40. Typically the tuning signal is a voltage from the loop filter 50.

Divider 60:

The divider provides a divider output signal (Dout) 70 which has a period consisting of an active pulse and an inactive time. The period of the output signal is controlled by an external signal, the divide ratio, (Ndiv) 80, and the VCO frequency output signal (fo) 30. Typically, the Divider counts cycles of the output signal (fo) 30 and provides an active pulse in which the divider output signal (Dout) 70 is high for a predetermined number of cycles and an inactive time in which Dout 70 is low for another predetermined number of cycles. The sum of the active pulse and the inactive time is the period of Dout 70. The number of cycles in the period of the divider output signal is controlled by the Programable Divide Ratio generator 190. The Programmable Divide Ration Generator 190 may comprise a $\Delta\Sigma$ (delta-sigma) modulator to provide fractional-N operations. Optionally, the divider also responds to a pulse width control signal, PWidth 90 such that the active pulse width of the divider is controlled by this signal. The width of the pulse during the inactive time (the inactive pulse width) can vary to provide the desired division ratio. This will allow the generation of the desired output frequency.

The composite PFD 100 is comprised of an analog PD 110, a digital PFD 120, and a converter 130.

Analog Phase Detector 110:

The analog phase detector 110 provides a phase error signal Ipa 140, proportional to the difference in phase between a reference signal Ref 150 and Dout 70. Typically, the phase difference between Ref 150 and Dout 70 is defined by the difference in time of the rising edges as in, for example, the MC12040 type of phase detector produced by Motorola. Phase difference can also be defined in terms of both rising and falling edges as in an exclusive or (XOR) phase detector. Typically, the phase error signal is a current produced by a charge pump controlled by a MC12040 type of phase detector. It could also be a voltage produced by a sample and hold phase detector.

Digital Phase/Frequency Detector 120 with a Dead Zone:

The digital phase/frequency detector 120 provides a phase error correction signal (Ipd) 160. The polarity of the phase error correction signal Ipd 160 changes in correspondence to whether a predetermined edge divider leads or lags a predetermined edge of the reference signal.

Loop Filter 50:

The Loop Filter 50 provides a tuning signal, Vtune 40, responsive to a phase error signal Ip 70. The Loop Filter helps to remove high frequency components from the tuning signal and provides an open loop PLL gain which will result in stable negative feedback when the loop is closed.

Reference Generator 180:

The reference generator 180 is an oscillator which provides a sufficiently accurate reference signal 150 to the composite PFD 100. Such a reference generator 180 is well known in the art.

Programmable Divide Ratio Generator 190:

The programmable divide ratio generator 190 provides the external divider ratio signal,Ndiv 80 to the divider 60. This device is well known in the art.

Converter 130:

The converter 130 is part of the composite PFD 100. The converter 130 is coupled to receive the signals Ipa 140 and Ipd 160 from the digital PFD 120 and analog PD 110. These two signals are converted to form the signal Ip 170 which is received by the loop filter 30.

As can be seen from FIG. 1, the composite PFD 100 has 2 PD's: the digital PFD 120 and the analog PD 110. The analog PD 110 has low noise and low sensitivity to power supply variations while the digital PFD 120 has a high phase detector gain and can provide frequency steering. To prevent contention issues between these two components, the PLL circuit 10 effectively switches between them. Given that the analog PD 110 is linear in characteristic only when in its phase detector window, it is desirable to use the analog PD 110 only in this time slot.

Furthermore, given that the digital PFD 120 is essentially useless while in its dead zone, it is not desirable to utilize it in this time slot. Thus, by synchronizing the analog PD 110's PD window to be within the dead zone of the digital PFD 120, we can take advantage of the benefits of both PD's.

The above can be accomplished by having the analog PD 110 active (within its PD window) during the active pulse of the divider output and by having the digital PFD 120 inactive (within its dead zone) during the same time frame (within the active pulse of the divider output). This means that, while the divider output is in its active pulse, the analog PD 110 provides the phase detection and frequency steering functions for the PLL with the digital PFD 120 effectively inactive. However, when the divider output is within its inactive pulse, the digital PFD 120 provides the phase detection and frequency steering functions for the PLL with the analog PD effectively inactive.

The scheme outlined above can be implemented by designing the digital PFD 120 and the analog PD 110 accordingly.

Analog PD

Figure 2:
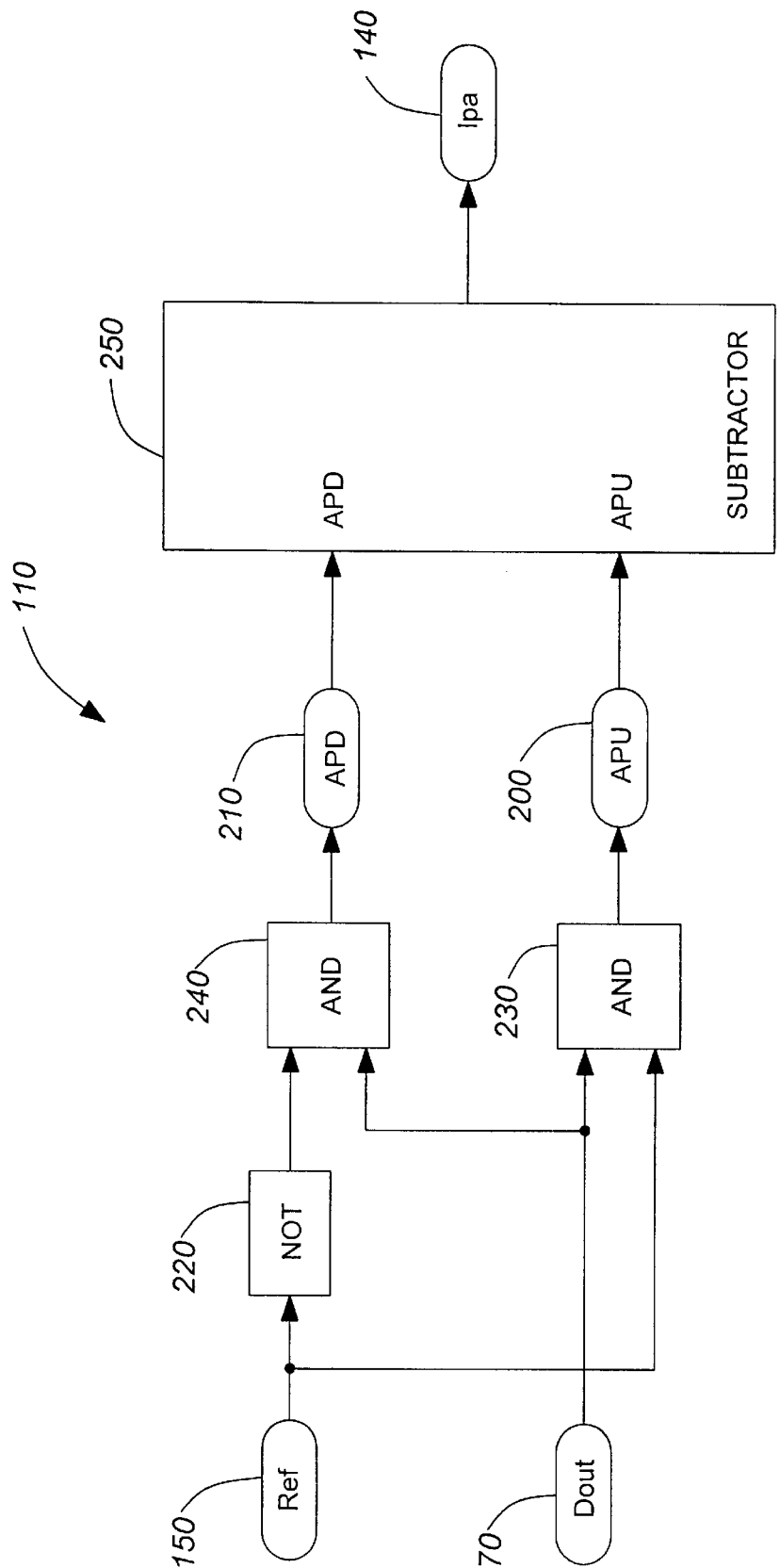
FIG. 2 is a schematic diagram of an analog phase detector according to the invention.

With respect to the analog PD 110, FIG. 2 illustrates one design which allows the analog PD 110 to be active within the active pulse of the divider output and otherwise effectively inactive.

The analog PD 110 in FIG. 2 is essentially a Balanced Tri-State phase detector which can produce a signal with a fixed amplitude A. The phase error signal Ipa 140 can have three possible values: +A, 0, −A.

The phase error correction signal, (Ipa) is of a predetermined amplitude during the active pulse of the divider and of zero amplitude during the inactive time of the divider. The polarity of the phase error correction signal changes in correspondence to the state of the reference signal. If the reference signal is positive, the correction signal is positive. If the reference signal is negative, the correction signal is negative.

These three values are obtained by having the analog PD 110 internally generate two signals APU 200 and APD 210.

The digital signal Analog Pump Up APU 200 would cause the VCO to run faster as this means the frequency output 30 lags the reference signal. The digital signal (Analog Pump Down) APD 210 would cause the VCO to run slower as this means the frequency output is leading the reference signal.

The signals APU 200 and APD 210 are obtained by suitably gating the reference signal Ref 150 and the divider output Dout 70. As can be see from FIG. 2, the reference signal Ref 150 is fed into a NOT gate 220 and a first AND gate 230. A second AND gate 240 receives the output of the NOT gate 220 and the divider output Dout 70. Thus, the gating circuitry in FIG. 2 implements the following logical equations:

APU=Ref AND Dout

APD=$\overline{\text{Ref}}$ AND Dout

Figure 2A:
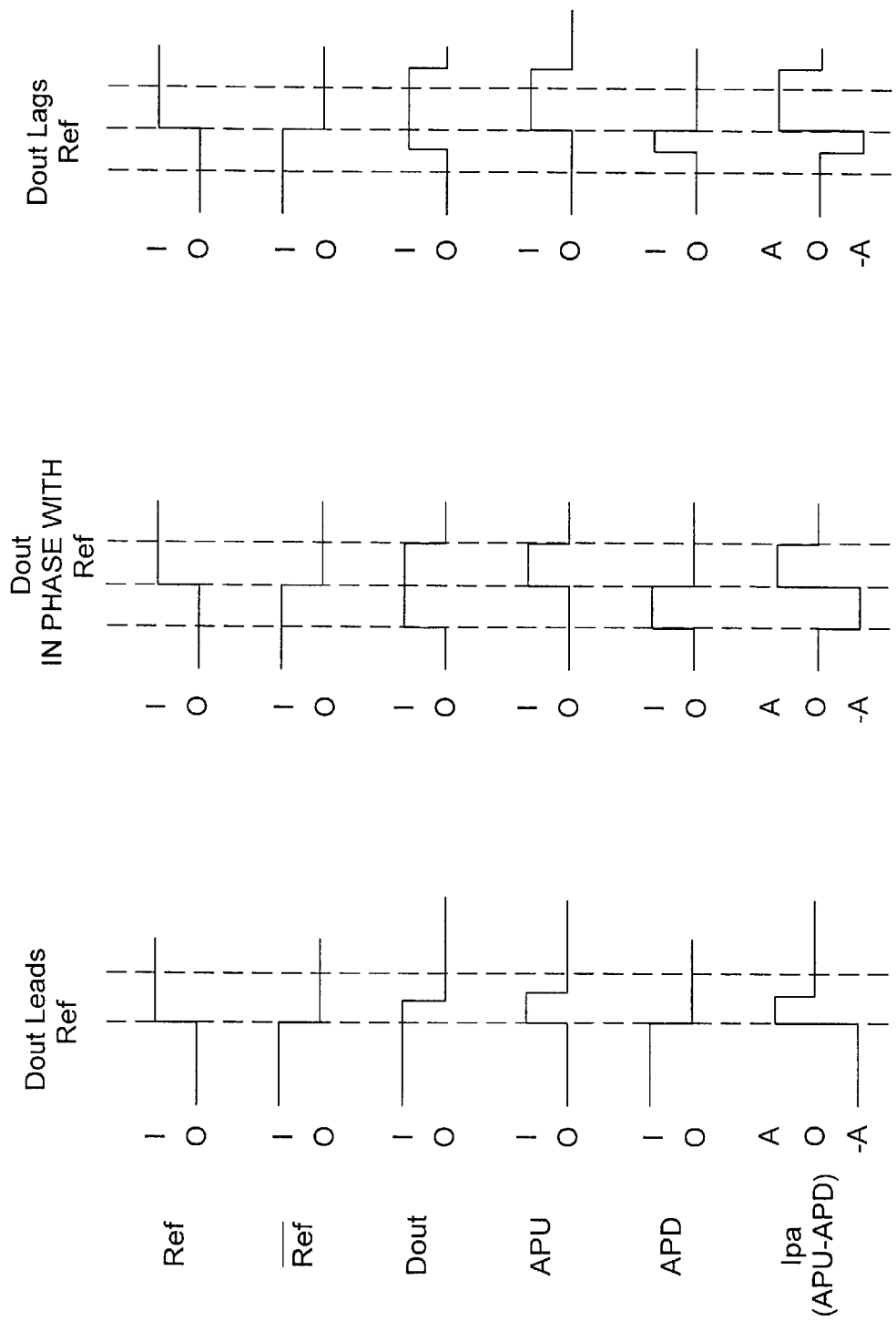
FIG. 2A is a collection of timing diagrams illustrating the relationships between the signals in the analog phase detector.

However, to generate the phase error signal Ipa 140, a subtractor 250 is required. The subtractor 250 subtracts APD 210 from APU 200 to directly generate the phase error signal Ipa 140. If the divider output Dout 70 lags the reference signal 150, signal APU 200 would be logical LO and APD 210 would be logical HI during the lag time, generating a phase error signal Ipa of amplitude −A during the lag time. This is because the relationship between Ipa and the two digital signals is represented by Ipa=APU−APD. Conversely, if the divider output Dout 70 leads the reference signal 150, the signal APU 200 is logical HI during the lead time and logical LO otherwise. Signal APD 210 is logical HI when the reference signal 150 and divider output Dout 70 are of opposite polarities. Because of this, the signal Ipa is of amplitude +A during the period when the signal Dout leads the reference signal. If the reference signal 150 is in phase with the divider output Dout 70, both APU 200 and APD 210 are logical HI during alternating periods, giving a balanced phase error signal Ipa whose net effect is of no change to the divider output. To best illustrate the above relationships between the signals, FIG. 2A shows the different relevant signals when the divider output Dout 70 leads, lags, or is in phase with the reference signal 150. The signal Ipa can be generated by a charge pump within the subtractor 250 which produces a voltage with an amplitude suitable for the combiner 130.

Digital PFD

With respect to the digital PFD 120, it is clear from the above that the dead zone of the digital PFD 120 must be aligned with both the active pulse of the divider output 70 and the PD window of the analog PD 110. This can be accomplished by implementing the circuit illustrated in FIG. 3.

Figure 3:
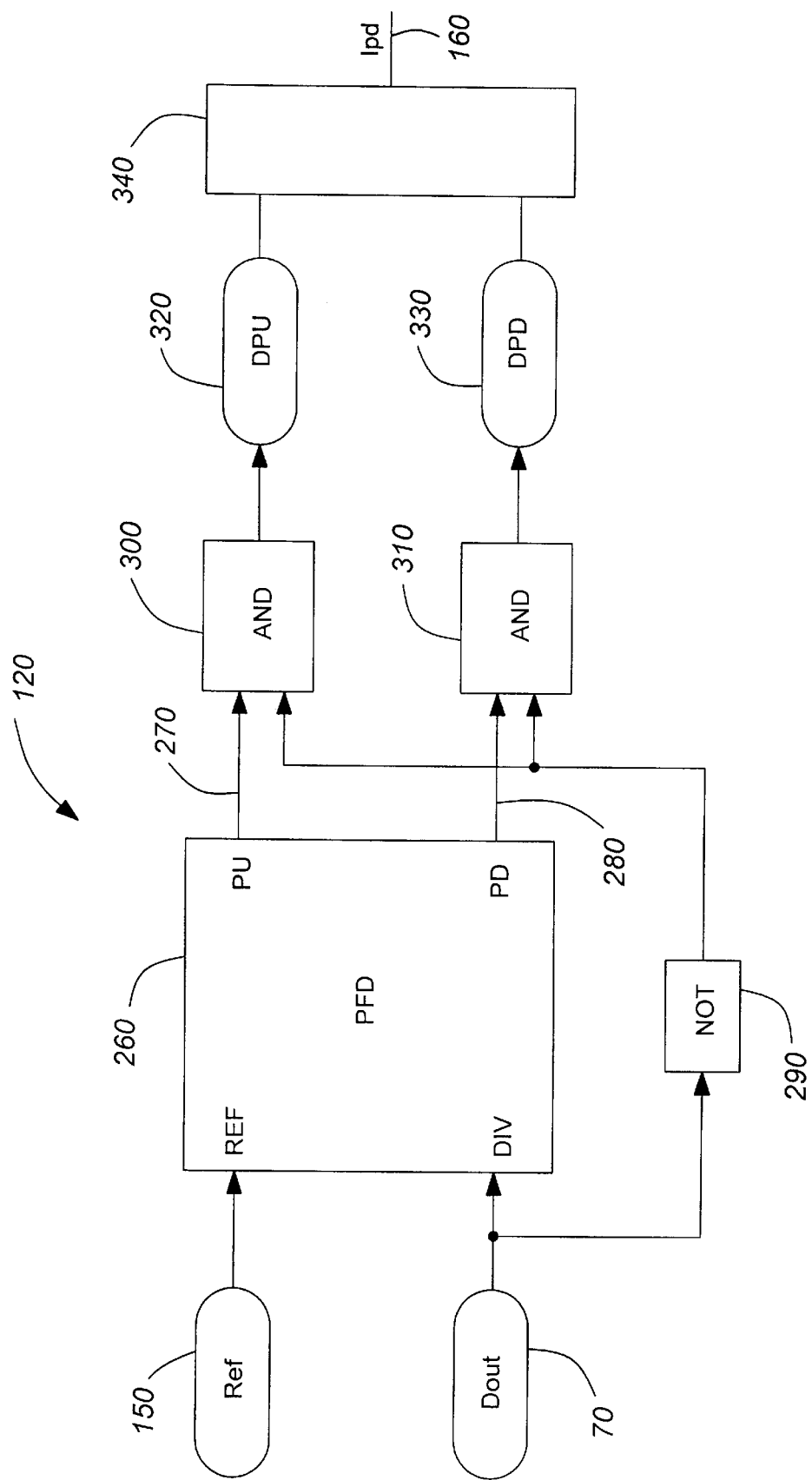
FIG. 3 is a schematic diagram of a digital phase/frequency detector according to the invention.

FIG. 3 illustrates how a well known and conventional PFD 260 can be used to extend a digital PFD's dead zone with suitable logical gating. It should be noted that the conventional PFD 260 produces digital signals (Pump Up) PU 270 and (Pump Down) PD 280 depending on whether and by how much the divider output 70 is leading or lagging the reference signal 150. The signals PU 270 and PD 280 are responsive to phase errors between the reference signal 150 and the divider output 70.

As can be seen from FIG. 3, the dead zone of the digital PFD 120 is extended by feeding the divider output 70 into a NOT gate 290 and feeding the output of the NOT gate 290 to an AND gate 300. Into this AND gate 300 is also fed the digital signal PU 270. A second AND gate 310 receives the PD 280 signal and also the output of the NOT gate 290. The output of the AND gate 300 produces signal DPU 320 that is internal to the digital PFD 120. Also internal to the digital PFD is the signal DPD 330, the output of the AND gate 310.

Thus, from the logical gating in FIG. 3, as long as the divider output 70 is not in its active pulse, either the signal DPD 330 or the signal DPU 320 is active. If the divider output 70 is within its active pulse, neither DPU 320 nor DPD 330 can have a logical HI value.

The signals PU 270 and PD 280, while digital, also provide the magnitude of the lead or lag between the reference signal 150 and the divider output Dout 70 by the length of their digital pulses.

It should be noted that a combiner 340 is also required in the digital PFD 120 to produce the phase error correction signal Ipd 160. The combiner 340 has a change pump which produces the phase error correction signal 160 depending on the signals DPU 320 and DPD 330. If DPU 320 is logical HI then combiner 340 produces a pump up signal to cause the VCO 20 to run faster while if the DPD 330 is logical HI then combiner 340 produces a pump down signal to cause the VCO 20 to run slower.

From the digital PFD 120 and the analog PD 110, the converter 130 receives both the error correction signals Ipd 160 and Ipa 140. Ideally, only one of these error correction signals should be active at any one time. However, by setting the error correction signal Ipd 160 to have a higher magnitude than Ipa 140, the digital PFD 120 output Ipd 160 should take precedence, thereby causing the PLL to acquire lock faster. The converter 130 produces the signal Ip 170 based on whether the signals Ipd 160 or Ipa 140 indicate a need to cause the VCO 20 to operate faster or slower.

The signal Ip 170 is received by the loop filter 30 which is also a voltage generator. Based on the signal Ip 170 from the composite PFD 100, the loop filter generates the proper voltage signal Vtune 40 to cause the VCO 20 to either run faster, slower or neither.

It should be noted that the above descriptions assume that the divider output is a logical one (or HI) during the active pulse.

Divider 60

Figure 4:
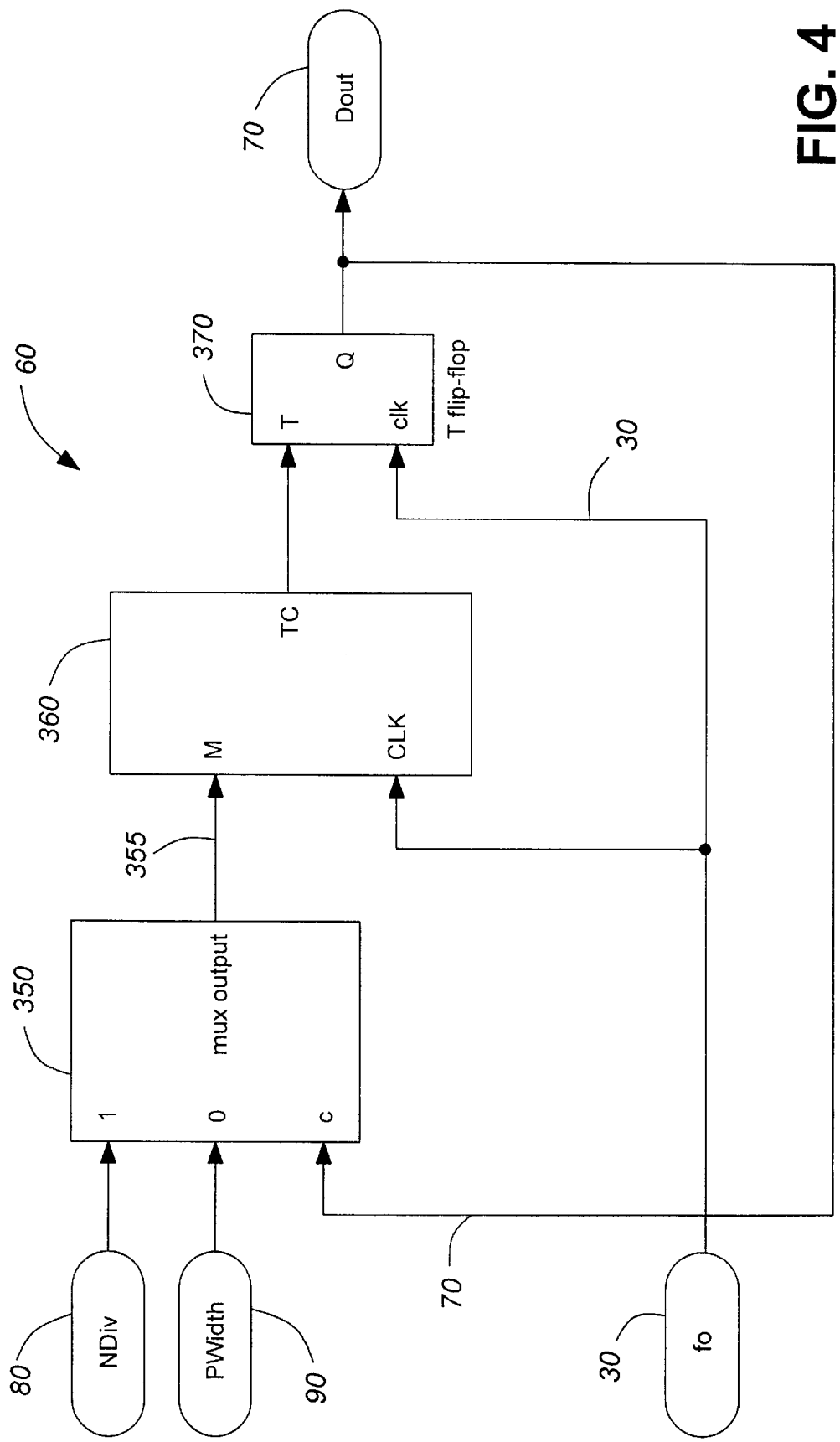
FIG. 4 is a schematic diagram of a divider according to the invention.

FIG. 4 illustrates an embodiment of the divider 60. The divider 60 is comprised of a multiplexer 350, a synchronous counter 360 and a T flip-flop 370.

The multiplexer 350 is a 2×1 multiplexer receiving the divide ratio Ndiv 80 and the pulse width control signal Pwidth 90 as its inputs. The select signal for the multiplexer 350 is provided by the divider output Dout 70. Thus, if the divider output Dout 70 is HI, the divide ratio Ndiv 80 is chosen, while if the divider output Dout 70 is LO, the pulse width control signal PWidth 90 is chosen. Whichever input is chosen, the multiplexer output 355 is transmitted to the synchronous counter 360.

The synchronous counter 360 is a loadable down counter. The counter 360 has an input M, a clock input CLK, and an output TC. The input M is the value from which the counter counts down, with a decrement for every pulse received from the clock input CLK. The normal value for TC is LO while the counter 360 is counting down. However, once the counter 360 has reached 0, the value of the signal TC changes to HI until a new value M is loaded.

For this application, the counter 360 receives its clock input CLK from the frequency output 30 and its initial value M from the multiplexer 350. Thus, if the pulse width control signal PWidth 90 is loaded into the initial value M, the counter produces a HI pulse for every X pulses of the frequency output fo 30 with X being the value of the pulse width control signal PWidth 90. Similarly, if the value of the divide ratio Ndiv 80 is Y, and if the divide ratio Ndiv 80 is loaded into M, the counter 360 produces a pulse HI for every Y pulses of the frequency output fo 30.

The T flip-flop 370 receives the counter output TC of the counter 360 and a clock input CK from the frequency output fo 30. Since the T flip-flop (also known as toggle flip-flop) compliments its output Q only when a HI is detected in its input T, the state of its output Q is constant until a HI is detected at its input T.

The workings of the above can now be explained. By loading either the pulse width control signal PWidth 90 or the divide ratio signal Ndiv 80 into the counter 360, the appearance of a HI pulse at the counter output TC is controlled. So, if Ndiv=10 and PWidth=15, the counter 360 produces a HI pulse every 10 or 15 pulses of the frequency output to 30, depending on which value was received by the counter 360. This HI pulse causes the Q output of the T flip-flop 370 to change every 10 or 15 pulses of the frequency output fo 30. The Q output of the T flip-flop 370 is therefor the divider output Dout 70 with an active pulse width controlled by the pulse width control signal PWidth 90 and an inactive pulse width controlled by the divide ratio Ndiv 80.

It should be noted that while the embodiment illustrated shows a pulse width control signal PWidth 90 that is controllable, the divider 60 will be equally workable if the pulse width control signal PWidth 90 is a constant signal.

Figure 5:
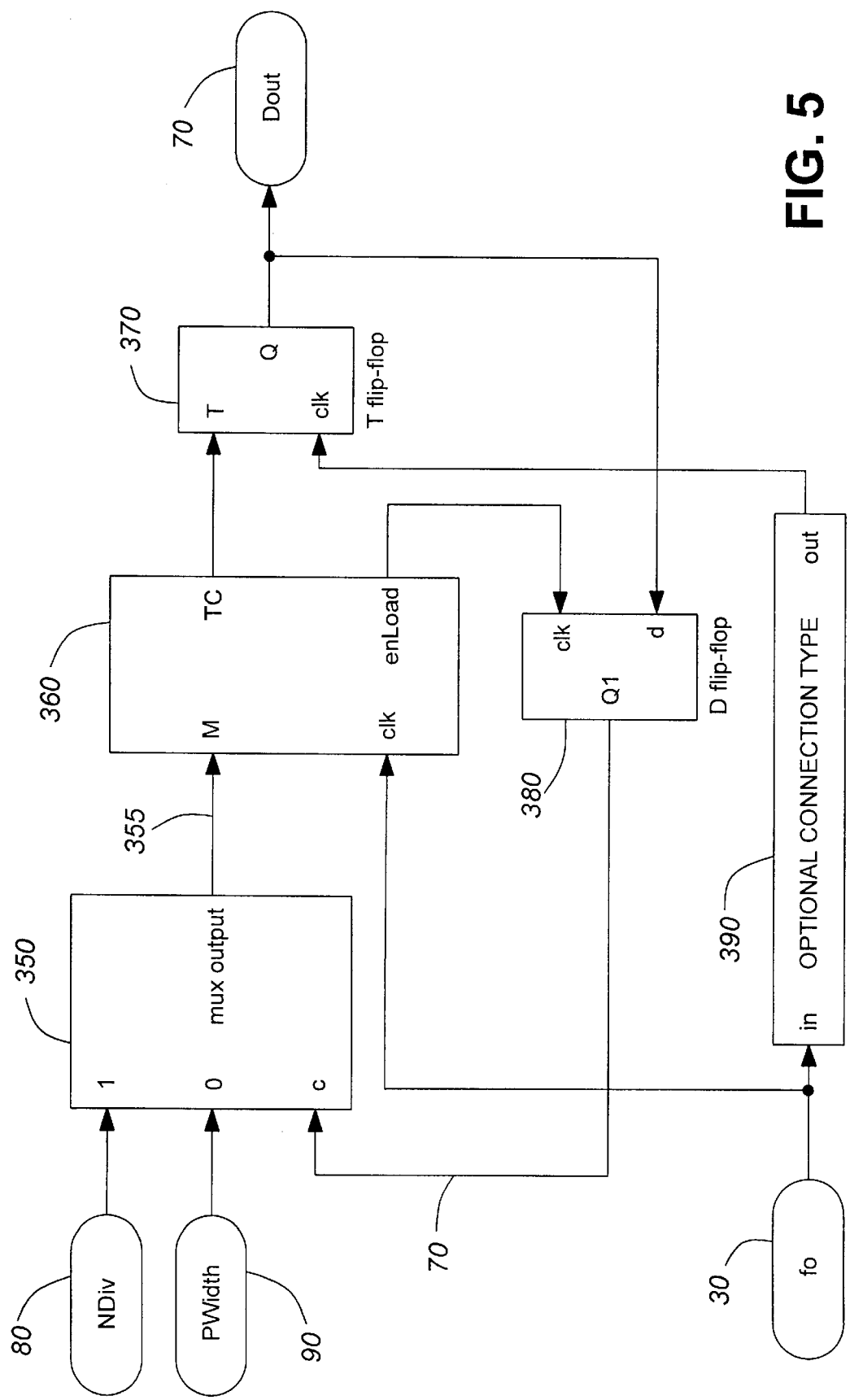
FIG. 5 is a schematic diagram of an alternative divider according to the invention.

FIG. 5 illustrates another embodiment of the divider 60. It is known that some synchronous counters require that their inputs M only change at certain times. For these counters, if the inputs change at other times, the counters do not work properly. Normally, such counters provide an ENABLE LOAD (ENLOAD) input which allows a change in the input M. The circuit in FIG. 5 provides a D flip-flop 380 to account for such counters. The D flip-flop 380 is used to regulate when the T flip-flop output Q (the same as the divider output Dout 70) is applied to the multiplexer 350. Thus, the D flip-flop 380 applies the select signal to the multiplexer 350 when the ENLOAD signal is present. In some cases, those implementing this will find that it is necessary to have the T flip-flop 370 respond to the falling edge of the frequency output fo 30 while the counter 360 responds to the rising edge of the frequency output fo 30. If this is the case, it will be necessary to include a connection type 390 which would invert the frequency output fo 30 or alternatively to have the T flip-flop 370 respond directly to falling edges instead of rising edges. The delay through the counter 360 from the frequency output fo 30 to the TC output of the counter 360 determines this decision and should be understood by those versed in the art.

Aside from the above differences, the embodiments of the divider 60 pictured in FIGS. 4 and 5 work similarly.

It should be reiterated that this divider 60 has the unique characteristic that its pulse width can be controlled. The controllability of the pulse width allows some optimization with respect to the noise generated. When using a balanced Tri-State analog phase detector as illustrated above, the noise in the components may increase as the pulse width increases. However, the linearity of the response of the analog PD also increases with the increased pulse width. Thus, obtaining the lowest acceptable linearity with the least noise requires using a certain pulse width. With regard to the controlled dead zone of the digital PFD 120 above, a narrow active pulse width is desirable in many cases. This is so that the PLL can have a wide bandwidth until the PLL has settled to a small phase error. However, too narrow a pulse can cause the dead zone to not be sufficiently dead, allowing digital feed through from the digital PFD 120 to corrupt the phase error signal.

The controllability of the pulse width thus allows the user of the invention leeway to optimize the performance of the PLL to his or her own needs with the competing trade offs in mind.

Further to the above, a few points should be made when implementing the divider 60 in different PLLs. When a Delta-Sigma modulator is used in the control means 190 for the divider 60, and a balanced tri-state phase detector is used, the pulse width of the divider should be wider than the Delta-Sigma produced jitter on the divider output Dout. This has the advantage that the Delta-Sigma produced jitter falls entirely within the linear phase detector window of the balanced tri-state phase detector. This prevents Delta-Sigma quantization noise and its non-linear intermodulation components from corrupting the base band phase error signal.

When a Delta-Sigma modulator is used in the control means for the divider, and a Controlled Dead-Zone Digital Phase/Frequency Detector is used, the pulse width of the divider should be wider than the Delta-Sigma produced jitter on the divider output. This has the advantage that the Delta-Sigma produced jitter falls entirely within the dead zone of the Controlled Dead-Zone Digital Phase/Frequency Detector. This prevents Delta-Sigma quantization noise and its non-linear intermodulation components from corrupting the base band phase error signal.

The divider 60 has the interesting characteristic that the T flip-flops 370, 380 should be substantially insensitive to interference from other components in the same integrated circuit, packaging, or printed circuit board. The advantage of this divider 60 is that since the frequency output signal fo 30, directly clocks the output Q of T flip-flop 370 which in turn directly controls the composite phase detector 100, the rest of the divider 60 is more insensitive to outside interference. Also, the wider pulse width at the divider output generates less high frequency content and thereby less high frequency interference for the other sensitive circuits in and around the chip.

Figure 6:
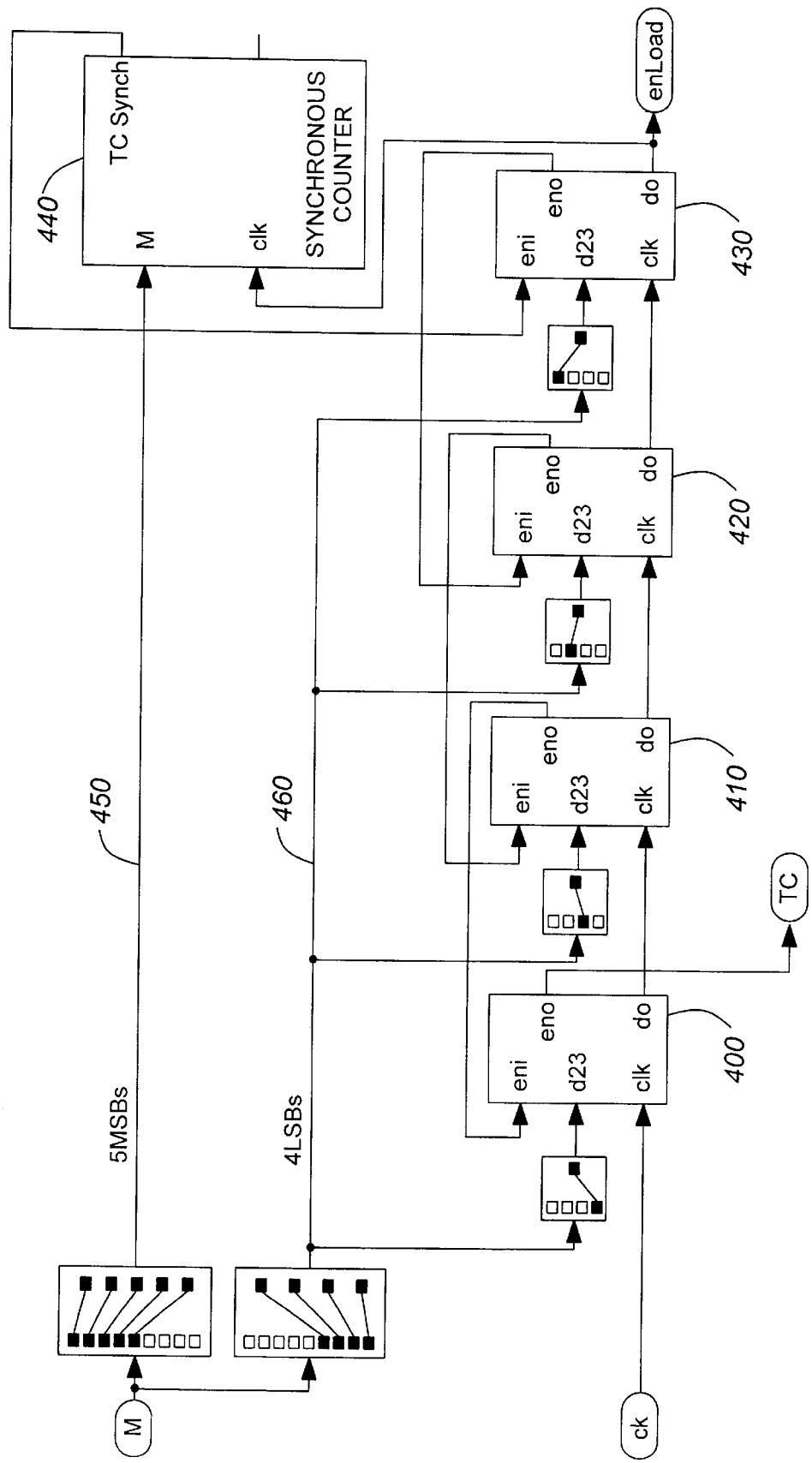
FIG. 6 is a schematic diagram of a synchronous counter according to the invention.

Referring to FIG. 6, illustrated is an embodiment of the counter 360. Since the input M to the counter 360 is a digital value and since the CLK input is provided by the frequency output fo 30, the circuit shown in FIG. 6 produces the required signals TC. It should be noted that the counter 360 shown in FIG. 6 requires an ENABLE LOAD or ENLOAD signal as shown in FIG. 5.

A divide by 2 or divide by 3 stage divides its input signal CK to produce output signal D0 where D0 is either the input frequency divided by 2 or the input frequency divided by 3. It divides by 2 normally and when both its D23 and its ENI inputs are logically true, it divides by 3. There are four of these divide by ⅔ indicated in FIG. 5, 400, 410, 420 and 430. The other component is a synchronous counter 440. There are many types of synchronous counters that are well established in the prior art. The selection blocks which are unlabelled provide a means of selecting particular input bits from a larger bus. Now describing the connections in FIG. 6, we have an input M, the 5 most significant bits MSB's 450 of which are distributed amongst the various divide by ⅔ stages 400, 410, 420 and 430. The least significant bits LSB of M are applied to D23 input on the first divide by 2–3 block 400. The second LSB input of M is applied to D23 input of the second divide by 2–3 block 410. The third LSB of M is applied to the third divide by 2 or 3 block 420. And the fourth LSB of M is applied to the fourth divide by 2–3 block 430. If there are different numbers of divide by 2–3 blocks or a different bus width M, the widths of these would all change. In this particular example there are four divide by 2–3 blocks.

Regarding the synchronous counter 440, its input M2 is connected to the 5 MSB's 450 of the M input bus. Its clock input is provided by output D0 and the fourth divide by 2–3 block 430. The output D0 is also the EN load output signal indicating that it is an acceptable time to change the input M. The terminal count of the synchronous counter TC-sync is used as the ENI input of the fourth divide by 2–3 block 430. This and the D23 input of the fourth divide by 2–3 block 430 is used to control when the divide by 2 or 3 block divides by 3. The other output of divide by ⅔ block 430 out or ENO which is used as the enable input (ENI) of the third divide by 2–3 block 420. The clock input to the third divide by 2 or 3 block 420 D0 the output from the second divide by 2–3 block 410. The D0 output of 420 provides a clock input to the fourth divide by 2–3 block 430. Another output ENO of 420 is used as an enable input ENI to the second divide by 2–3 block 410. The second divide by 2–3 block 410 D23 has an input from the second LSB of the M input bus. The clock input is CK for block 420 is provided by the divider output D0 of the first D 2–3 block 44. The output D0 of the block 410 to the clock input of the third divide by 2 or 3 block 420. The other inputs for the first divide by 2–3 block 460 are the LSB of the M bus and a clock input from CLK. The D0 output of block 400 is applied as the clock input CK of the second divide by 2–3 block 410 and its enable output ENO is the overall counter output TC.

It should be noted that the logic gates illustrated in the Figures and described above can easily be implemented using components that provide functions which are logical equivalents to the logical gates. Such components can be analog, digital, or a combination of both.

A person understanding the above-described invention may now conceive of alternative designs, using the principles described herein. All such designs which fall within the scope of the claims appended hereto are considered to be part of the present invention.

I claim:

1. A phase locked loop (PLL) frequency synthesizer comprising:

a composite phase frequency detection (CPFD) having a CPFD output;

a loop filter having a voltage output;

a voltage controlled oscillator (VCO) having a frequency output; and a divider having a divider output, the divider output having an active pulse with a first fixed width and an inactive pulse with a second width;

wherein the CPFD is coupled to receive the divider output;

the CPFD is coupled to receive a reference signal from a reference signal generator;

the loop filter is coupled to receive the CPFD output;

the VCO is coupled to receive the voltage output, said voltage output controllably affecting the frequency output;

the divider is coupled to receive the frequency output;

the loop filter generates the voltage output based on the CPFD output;

the CFPD output indicates a phase difference between the divider output and the reference signal; and the frequency output has a frequency that is a multiple of the frequency of the divider output.

2. A PLL frequency synthesizer as in claim 1 wherein the composite PFD comprises:

a digital PFD having a dead zone, the said dead zone being a time range when the digital PFD has no output;

an analog phase detector (PD) with a PD window and a PD output, said PD window being a time range when the analog PD operates linearly; and a converter coupled to receive both the digital PFD output and the PD output;

wherein an output of the converter is the CFPD output;

the digital PFD is coupled to receive the reference signal and the divider output;

the analog PD is coupled to receive the reference signal and the divider output;

the digital PFD output indicates a presence and a magnitude of a phase difference between the reference signal and the divider output when the digital PFD is not in the dead zone;

the analog PD output is proportional to the phase difference between the reference signal and the divider output when the analog PD is within the PD window; and the dead zone is within the PD window.

3. A PLL frequency synthesizer as in claim 2 wherein the divider is coupled to receive a divide ratio signal, said divide ratio signal determining the second fixed width of the inactive pulse.

4. A PLL frequency synthesizer as in claim 2 wherein the divider is coupled to receive a pulse width signal, said pulse width signal determining the first fixed width of the active pulse.

5. A PLL frequency synthesizer as in claim 4 wherein the divider is coupled to receive a divide ratio signal, said divide ratio signal determining the second fixed width of the inactive pulse.

6. A PLL frequency synthesizer as in claim 2 wherein the dead zone and the PD window are within the duration of the active pulse.

7. A PLL frequency synthesizer as in claim 2 wherein the analog PD comprises:
   a NOT gate coupled to receive the reference signal and having an output;
   a first AND gate coupled to receive the output of the NOT gate and the divider output, said first AND gate having an output;
   a second AND gate coupled to receive the reference signal and the divider output, said second AND gate having an output; and
   a subtractor circuit coupled to receive the output of the first AND gate and the output of the second AND gate, said subtractor circuit having an output which is the difference between the output of the first AND gate and the output of the second AND gate;
   wherein the output of the subtractor is the analog PD output.

8. A PLL frequency synthesizer as in claim 2 wherein the digital PFD comprises:
   a phase frequency detector coupled to receive the reference signal and the divider output, the PFD producing a pump up signal and a pump down signal, said pump up signal and pump down signal being produced depending on the presence and magnitude of a phase difference between the divider output and the reference signal;
   a PFD NOT gate coupled to receive the divider output;
   a first PFD AND gate coupled to receive an output of the PFD NOT gate and the pump up signal from the PFD;
   a second PFD AND gate coupled to receive the output of the PFD NOT gate and the pump down signal from the PFD; and
   a combiner coupled to receive the output of the first PFD AND gate and the output of the second PFD AND gate, said combiner producing the digital PFD output based on the output of the first PFD AND gate and the output of the second PFD AND gate.

9. A PLL frequency synthesizer as claimed in claim 2 wherein said digital PFD output is larger in magnitude than the analog PD output when the digital PFD is not in the dead zone.

10. A PLL frequency synthesizer as claimed in claim 1 wherein the divider comprises:
    a 2×1 multiplexer coupled to receive:
       a divide ratio signal;
       a pulse width signal; and
       the divider output; said multiplexer multiplexing between the divide ratio signal and the pulse width signal to produce a multiplexer output, said multiplexing being determined by the divider output;
    a synchronous counter coupled to receive the multiplexer output and the frequency output signal, said counter being constructed and arranged to conduct a count down from a value determined by the multiplexer output with the frequency output signal providing a clock signal, said counter producing a count pulse when the count down is terminated; and
    a T flip-flop coupled to receive the count pulse from the synchronous counter and further coupled to receive the frequency output signal as the clock signal, the T flip-flop having an output which is the divider output.

11. A PLL frequency synthesizer as claimed in claim 10 wherein the divider further includes:
    a D flip-flop between the divider output and the multiplexer, said D flip-flop receiving:
       the divider output as an input;
       a load output of the synchronous counter as a clock signal;
       and wherein the multiplexer receives the divider output as an output of the D flip-flop.

12. A PLL frequency synthesizer as in claim 7 wherein the digital PFD comprises:
    a phase frequency detector coupled to receive the reference signal and the divider output, the PFD producing a pump up signal and a pump down signal, said pump up signal and pump down signal being produced depending on the presence and magnitude of a phase difference between the divider output and the reference signal;
    a PFD NOT gate coupled to receive the divider output;
    a first PFD AND gate coupled to receive an output of the PFD NOT gate and the pump up signal from the PFD;
    a second PFD AND gate coupled to receive the output of the PFD NOT gate and the pump down signal from the PFD; and
    a combiner coupled to receive the output of the first PFD AND gate and the output of the second PFD AND gate, said combiner producing the digital PFD output based on the output of the first PFD AND gate and the output of the second PFD AND gate.

13. A PLL frequency synthesizer as in claim 12 wherein the divider is coupled to receive a divide ratio signal, said divide ratio signal determining the second width of the inactive pulse and wherein the divider is coupled to receive a pulse width signal, said pulse width signal determining the first fixed width of the active pulse.

14. A PLL frequency synthesizer as in claim 13 wherein the dead zone and the PD window are within the duration of the active pulse.

15. A PLL frequency synthesizer as in claim 14 wherein the divider comprises:
    a 2×1 multiplexer coupled to receive:
       a divide ratio signal;
       a pulse width signal; and
       the divider output;
       said multiplexer multiplexing between the divide ratio signal and the pulse width signal to produce a multiplexer output, said multiplexing being determined by the divider output;
    a synchronous counter coupled to receive the multiplexer output and the frequency output signal, said counter being constructed and arranged to conduct a count down from a value determined by the multiplexer output with the frequency output signal providing a clock signal, said counter producing a count pulse when the count down is terminated; and
    a T flip-flop coupled to receive the count pulse from the synchronous counter and further coupled to receive the frequency output signal as the clock signal, the T flip-flop having an output which is the divider output.

16. A PLL frequency synthesizer as in claim 15 wherein the divider further includes:
    a D flip-flop between the divider output and the multiplexer, said D flip-flop receiving:
       the divider output as an input;

a load output of the synchronous counter as a clock signal;

and wherein the multiplexer receives the divider output as an output of the D flip-flop.

17. A composite phase frequency detector (PFD) for determining a phase difference between a reference signal and an input signal, the composite phase frequency detector comprising:

a digital PFD having a dead zone, the said dead zone being a time range when the digital PFD has no output;

an analog phase detector (PD) with a PD window and a PD output, said PD window being a time range when the analog PD operates linearly; and a converter coupled to receive both a digital PFD output and a PD output;

wherein an output of the converter is the CFPD output;

the digital PFD is coupled to receive the reference signal and the input signal;

the analog PD is coupled to receive the reference signal and the input signal;

the digital PFD output indicates a presence and a magnitude of a phase difference between the reference signal and the input signal when the digital PFD is not in the dead zone;

the analog PD output is proportional to the phase difference between the reference signal and the input signal when the analog PD is within the PD window;

the dead zone is within the PD window; and said digital PFD output being larger in magnitude than the analog PD output when the digital PFD is not in the dead zone.

18. An analog phase detector (analog PD) for detecting differences in phase between a reference signal and an input signal, the analog PD comprising:

a NOT gate coupled to receive the reference signal and having an output;

a first AND gate coupled to receive the output of the NOT gate and the input signal, said first AND gate having an output;

a second AND gate coupled to receive the reference signal and the input signal, said second AND gate having an output; and a subtractor circuit coupled to receive the output of the first AND gate and the output of the second AND gate, said subtractor circuit having an output which is the difference between the output of the first AND gate and the output of the second AND gate;

wherein the output of the subtractor is the analog PD output.

19. A digital phase frequency detector (digital PFD) for detecting differences in phase and frequency between a reference signal and an input signal, the digital PFD comprising:

a phase frequency detector coupled to receive the reference signal and the input signal, the PFD producing a pump up signal and a pump down signal, said pump up signal and pump down signal being produced depending on the presence and magnitude of a phase difference between the input signal and the reference signal;

a PFD NOT gate coupled to receive the input signal;

a first PFD AND gate coupled to receive an output of the PFD NOT gate and the pump up signal from the PFD;

a second PFD AND gate coupled to receive the output of the PFD NOT gate and the pump down signal from the PFD; and a combiner coupled to receive the output of the first PFD AND gate and the output of the second PFD AND gate, said combiner producing the digital PFD output based on the output of the first PFD AND gate and the output of the second PFD AND gate.

20. A frequency divider for dividing the frequency of an input signal, the divider having a divider output and comprising:

a 2×1 multiplexer coupled to receive:

a divide ratio signal;

a pulse width signal; and the divider output;

said multiplexer multiplexing between the divide ratio signal and the pulse width signal to produce a multiplexer output, said multiplexing being determined by the divider output;

a synchronous counter coupled to receive the multiplexer output and the input signal, said counter being constructed and arranged to conduct a count down from a value determined by the multiplexer output with the input signal providing a clock signal, said counter producing a count pulse when the count down is terminated; and a T flip-flop coupled to receive the count pulse from the synchronous counter and further coupled to receive the input signal as the clock signal, the T flip-flop having an output which is the divider output.

21. A frequency divider as claimed in claim 20 wherein the divider further includes:

a D flip-flop between the divider output and the multiplexer, said D flip-flop receiving:

the divider output as an input;

a load output of the synchronous counter as a clock signal;

and wherein the multiplexer receives the divider output as an output of the D flip-flop.

22. A method of compensating for and detecting phase differences between a reference signal and a subject signal with a controllable pulse width using:

an analog phase detector having a phase detector window in which the analog phase detector is active during the phase detector window, the analog phase detector receiving the reference signal and the subject signal;

a digital phase frequency detector having a dead zone in which the digital phase frequency detector is inactive during the dead zone, the digital phase frequency detector receiving the reference signal and the subject signal; and a divider producing the subject signal with a controllable pulse width signal, the method comprising:

controlling the controllable pulse width of the subject signal and synchronizing the phase detector window and the dead zone such that:

the phase detector window and the dead zone are both within an active pulse of the subject signal.

23. A method of compensating for and detecting phase signal differences between a reference signal and a subject signal with a pulse width, the method comprising:

activating a digital phase frequency detector to provide phase frequency detection between the reference signal and the subject signal during an inactive pulse of the subject signal;

activating an analog phase detector to provide phase detection between the reference signal and the subject signal during an active pulse of the subject signal.

24. A method as in claim 23 further including controlling the controllable pulse width of the subject signal such that during an active pulse of the subject signal:

the digital phase frequency detector is within a dead zone; and the analog phase detector is within a phase detector window.

25. A method as in claim 24 further including controlling the controllable pulse width of the subject signal such that during an inactive pulse of the subject signal:

the digital phase frequency detector is not within the dead zone; and the analog phase detector is not within the phase detector window.

26. A method as in claim 23 further including synchronizing the dead zone and the phase detector window such that both the dead zone and the phase detector window occur at the same time and are both within an active pulse of the subject signal.

* * * * *